US012690277B2

(12) United States Patent
Pujari et al.

(10) Patent No.: US 12,690,277 B2
(45) Date of Patent: Jul. 21, 2026

(54) SOLDER PASTE FOR MODULE FABRICATION OF SOLAR CELLS

(71) Applicant: ALPHA ASSEMBLY SOLUTIONS INC., Waterbury, CT (US)

(72) Inventors: Narahari Pujari, Waterbury, CT (US); Siuli Sarkar, Waterbury, CT (US); Carl Bilgrien, Waterbury, CT (US)

(73) Assignee: Alpha Assembly Solutions Inc., Waterbury, CT (US)

( * ) Notice: Subject to any disclaimer, the term of this patent is extended or adjusted under 35 U.S.C. 154(b) by 51 days.

(21) Appl. No.: 17/595,690

(22) PCT Filed: May 22, 2020

(86) PCT No.: PCT/EP2020/025240
§ 371 (c)(1),
(2) Date: Nov. 22, 2021

(87) PCT Pub. No.: WO2020/233839
PCT Pub. Date: Nov. 26, 2020

(65) Prior Publication Data
US 2022/0216357 A1 Jul. 7, 2022

(30) Foreign Application Priority Data
May 23, 2019 (IN) .............................. 201911020476

(51) Int. Cl.
*B23K 1/00* (2006.01)
*B23K 35/00* (2006.01)
(Continued)

(52) U.S. Cl.
CPC ......... *H10F 19/906* (2025.01); *B23K 1/0016* (2013.01); *B23K 35/025* (2013.01); *H10F 19/908* (2025.01)

(58) Field of Classification Search
CPC ............. H01L 31/0512; H01L 31/0516; H01L 31/043; H01L 31/188; H01L 31/02021;
(Continued)

(56) References Cited

U.S. PATENT DOCUMENTS 9,356,184 B2 5/2016 Morad et al.
10,123,430 B2 * 11/2018 Marczi ................. B23K 35/302
(Continued)

FOREIGN PATENT DOCUMENTS

CN 1953150 A * 4/2007 ........... H05K 3/3485
CN 202633328 U * 12/2012
(Continued)

OTHER PUBLICATIONS

Eco-Solder Environment-friendly Lead Free Solder SMIC (2002).*

*Primary Examiner* — Kiley S Stoner
(74) *Attorney, Agent, or Firm* — Stinson LLP

(57) ABSTRACT

A method of fabricating a solar module by interconnection of a plurality of photovoltaic (PV) cells in which at least a first PV cell is interconnected to a second PV cell using an electrically-conductive adherent comprising or consisting of a solder paste. The solder paste comprises particles of solder alloy dispersed in a solder flux. The solder alloy comprises a Sn-containing solder alloy having a liquidus temperature of less than 225° C.

11 Claims, 3 Drawing Sheets

(51) Int. Cl.
  *B23K 35/02* (2006.01)
  *H10F 19/90* (2025.01)
(58) Field of Classification Search
  CPC ............. Y02E 10/50; B23K 1/00–206; B23K
  2101/36–42; B23K 3/0638; B23K 35/025
  USPC ................... 228/179.1–180.22, 248.1–248.5
  See application file for complete search history.

(56) References Cited

U.S. PATENT DOCUMENTS

| | | | |
|---|---|---|---|
| 2001/0002982 A1* | 6/2001 | Sarkhel ................ | B23K 35/262 228/178 |
| 2004/0016456 A1* | 1/2004 | Murozono ...... | H01L 31/022425 136/250 |
| 2012/0006483 A1 | 1/2012 | Hanoka et al. | |
| 2014/0048306 A1* | 2/2014 | Yang .................... | H01L 31/188 29/745 |
| 2014/0124014 A1* | 5/2014 | Morad ................. | H01L 31/042 136/246 |
| 2014/0219711 A1 | 8/2014 | Pandher et al. | |
| 2015/0078810 A1 | 3/2015 | Koep et al. | |
| 2015/0381109 A1 | 12/2015 | Choi et al. | |
| 2016/0016265 A1* | 1/2016 | Ishikawa ................ | B23K 35/22 427/282 |
| 2016/0318134 A1 | 11/2016 | Ribas et al. | |
| 2017/0186897 A1* | 6/2017 | Atchley .................. | H02S 40/36 |
| 2017/0323808 A1* | 11/2017 | Gislon ............... | H01L 31/0504 |
| 2017/0323995 A1* | 11/2017 | Gislon ............... | H01L 31/0504 |
| 2018/0053876 A1 | 2/2018 | Iida | |
| 2018/0138338 A1 | 5/2018 | Pretorius et al. | |
| 2018/0175233 A1* | 6/2018 | Reddy .................. | H01L 31/028 |
| 2018/0233615 A1 | 8/2018 | Lim | |
| 2018/0290244 A1 | 10/2018 | Pandher et al. | |
| 2020/0070287 A1* | 3/2020 | Mutuku ................. | C22C 30/06 |

FOREIGN PATENT DOCUMENTS

| | | | | | |
|---|---|---|---|---|---|
| CN | 202749400 U | * | 2/2013 | | |
| CN | 103406686 A | * | 11/2013 | | |
| CN | 103681921 A | * | 3/2014 | | |
| CN | 103988283 A | * | 8/2014 | ............. | H05K 3/202 |
| CN | 104040718 A | * | 9/2014 | ............. | H10F 19/33 |
| CN | 104521009 A | * | 4/2015 | ......... | H01L 31/0512 |
| CN | 104638043 A | * | 5/2015 | ......... | H01L 31/0201 |
| CN | 204348742 U | * | 5/2015 | | |
| CN | 204407340 U | * | 6/2015 | | |
| CN | 204834651 U | * | 12/2015 | | |
| CN | 105870216 A | * | 8/2016 | ......... | H01L 31/0224 |
| CN | 205657073 U | * | 10/2016 | | |
| CN | 106129162 A | * | 11/2016 | ....... | H01L 31/02002 |
| CN | 106180939 A | * | 12/2016 | | |
| CN | 106252435 A | * | 12/2016 | | |
| CN | 106653881 A | * | 5/2017 | ..... | H01L 31/022441 |
| CN | 106653912 A | * | 5/2017 | ..... | H01L 31/022441 |
| CN | 206451721 U | * | 8/2017 | | |
| CN | 107195702 A | * | 9/2017 | | |
| CN | 104752531 B | * | 12/2017 | | |
| CN | 206806349 U | * | 12/2017 | | |
| CN | 107863396 A | * | 3/2018 | ........... | H10F 71/137 |
| CN | 108046209 A | * | 5/2018 | ........ | B81C 1/00261 |
| CN | 108465973 A | * | 8/2018 | | |
| CN | 108649087 A | * | 10/2018 | ........... | H01L 31/042 |
| CN | 109743885 A | * | 5/2019 | ....... | H01L 31/02021 |
| CN | 110190145 A | * | 8/2019 | ........ | H01L 31/0516 |
| CN | 110212048 A | * | 9/2019 | ........ | H01L 31/0516 |
| CN | 110246911 A | * | 9/2019 | ..... | H01L 31/022441 |
| CN | 110429153 A | * | 11/2019 | ........... | H10F 71/121 |
| CN | 209981232 U | * | 1/2020 | ..... | H01L 31/022441 |
| CN | 209981250 U | * | 1/2020 | ........ | H01L 31/0516 |
| CN | 210120147 U | * | 2/2020 | ........ | H01L 31/0516 |
| CN | 210379078 U | * | 4/2020 | | |
| CN | 210575979 U | * | 5/2020 | | |
| CN | 108258074 B | * | 6/2021 | ........ | H01L 31/0508 |
| CN | 113327997 A | * | 8/2021 | ........ | H01L 31/0201 |
| CN | 215815896 U | * | 2/2022 | | |
| DE | 102008060651 A1 | * | 6/2010 | ............. | H01L 31/05 |
| DE | 102010054400 A1 | * | 6/2012 | ........ | H01L 31/0504 |
| DE | 102016122896 A1 | * | 5/2018 | | |
| DE | 102018217359 A2 | * | 4/2020 | ........... | B23K 35/025 |
| EP | 0282826 A2 | * | 9/1988 | | |
| EP | 1708281 A2 | * | 10/2006 | ........ | H01L 31/0504 |
| EP | 3809473 A1 | * | 4/2021 | | |
| EP | 3905341 A1 | * | 11/2021 | ........ | H01L 31/0504 |
| JP | 2002224880 A | * | 8/2002 | ........... | B23K 35/025 |
| JP | 2006049429 A | | 2/2006 | | |
| JP | 2007059322 A | | 3/2007 | | |
| JP | 2009111122 A | * | 5/2009 | | |
| JP | 2009130193 A | * | 6/2009 | | |
| JP | 4641109 B2 | * | 3/2011 | | |
| JP | 2011238849 A | * | 11/2011 | | |
| JP | 2014011232 A | | 1/2014 | | |
| JP | 2018133567 A | | 8/2018 | | |
| JP | 2021125603 A | * | 8/2021 | | |
| KR | 10-0990114 B1 | | 10/2010 | | |
| KR | 2010125989 A | * | 12/2010 | | |
| KR | 20100125988 A | * | 12/2010 | | |
| KR | 20100125989 A | * | 12/2010 | | |
| KR | 101121484 B1 | * | 3/2012 | | |
| KR | 20160001226 A | * | 1/2016 | | |
| KR | 20160149067 A | * | 10/2016 | | |
| KR | 20170047199 A | * | 5/2017 | | |
| KR | 2018067089 A | * | 6/2018 | ........... | B23K 35/025 |
| KR | 20130082056 A | * | 10/2019 | | |
| KR | 20180005722 A | * | 10/2019 | | |
| KR | 20190116772 A | * | 10/2019 | | |
| NL | 8900660 A | * | 10/1990 | ............. | H01L 31/05 |
| WO | 2010021685 A1 | | 2/2010 | | |
| WO | WO-2010133224 A2 | * | 11/2010 | ........... | H01L 31/046 |
| WO | WO-2012003099 A2 | * | 1/2012 | ........... | H01L 31/048 |
| WO | WO-2013095984 A1 | * | 6/2013 | ............. | H10F 19/35 |
| WO | WO-2016076353 A1 | * | 5/2016 | ............. | C22C 13/00 |
| WO | 2016152649 A1 | | 9/2016 | | |
| WO | WO-2016196759 A1 | * | 12/2016 | ..... | H01L 31/022425 |
| WO | 2018/209147 A1 | | 11/2018 | | |
| WO | WO-2019085447 A1 | * | 5/2019 | | |
| WO | WO-2020233839 A1 | * | 11/2020 | ........ | H01L 31/0512 |

* cited by examiner

SOLDER PASTE FOR MODULE FABRICATION OF SOLAR CELLS

The present specification is directed to solar modules and methods of fabricating solar modules that comprise photovoltaic (PV) cells that are interconnected using an electrically-conductive adherent comprising or consisting of a solder paste.

Background to the Disclosure

Conventional approaches for assembling a solar module from photovoltaic (PV) cells include the, so-called, "string and tab" method, wherein the PV cells are connected to each other with flat wire (bus) ribbons. Wire ribbon is typically coupled to a busbar position on the surface of the PV cell. Thicker wires have been found to be too hard, and thin and wide wires may lead to shading effect and failures.

Consequently other methods of interconnecting PV cells have been developed, including shingling, back contact and gluing. In these methods electrically conductive adhesives (ECAs) are used to connect the PV cells. For example, U.S. Pat. No. 9,356,184B2 describes a shingling method wherein a bottom conductive surface of one PV cell contacts the upper surface of an adjacent PV cell. Interconnection of the two PV cells is achieved via electrically conductive adhesives (ECAs).

ECAs typically comprise conductive particles dispersed in an organic medium. ECAs may not exhibit adequate resistance to environmental effects such as, for example, extremes of temperature. Conventional conductive adhesives may comprise an epoxy resin. In such adhesives, the hardening agent is flaky and hard leading to reduced flexibility of the connection. ECAs, especially those based on epoxy are also prone to form a gel after being kept in storage for a long time. There are reports that some ECAs do not meet thermal cycling requirements and power loss can be as high as 7% (I. Ullmann, D. Rudolph, J. Rabanal-Arabach, A. Schneider, A. Halm, Investigation on the Quality of Adhesive Joints of Shingled Solar Cells by Accelerated Lifetime Testing, 35th European Photovoltaic Solar Energy Conference and Exhibition, 2018, Brussels Belgium, 24-28 Sep. 2018, p: 1210-1213). In addition, ECAs such as, for example, those containing silver particles cannot typically be completely cured at low temperature. Accordingly, when a circuit or conductive layer or interconnection is formed on a substrate using such ECAs damage to the substrate or failure in reliability of device may occur. Another major limitation of the ECAs is the cost. Typically, the cost of silver-based ECAs is very high which can give rise to a substantial increase in module fabrication cost.

The present disclosure seeks to tackle at least some of the problems associated with the prior art.

SUMMARY OF THE DISCLOSURE

In a first aspect the present disclosure provides a method of fabricating a solar module by interconnection of a plurality of photovoltaic (PV) cells in which at least a first PV cell is interconnected to a second PV cell using an electrically-conductive adherent comprising or consisting of a solder paste;

the solder paste comprising particles of solder alloy dispersed in a solder flux;

wherein the solder alloy comprises a Sn-containing solder alloy having a liquidus temperature of less than 225° C.

Solder alloy used in conventional processes is typically employed in a ribbon or wire, in which a copper ribbon or wire is coated with the solder alloy. In such conventional wires and ribbons the copper provides the required yield strength and electrical conductivity. Since copper is not solderable, the wire or ribbon is coated with solder alloy. The present invention makes use of solder alloy in the form of a solder paste. With advanced interconnection techniques, such as "shingling", it is easier to print/dispense solder paste on the silver pads than placing a ribbon, for example.

The role of the solder flux is to provide printing performance and stability of the paste along with coalescence of solder particles at given reflow conditions. One of the obstacles to a successful solder joint is an impurity at the site of the joint, for example, dirt, oil or oxidation. The impurities can be removed by mechanical cleaning or by chemical means, but the elevated temperatures required to melt the filler metal (the solder) encourages the work piece (and the solder) to re-oxidize. This effect is accelerated as the soldering temperatures increase and can completely prevent the solder from joining to the workpiece. The flux may help to prevent oxidation during the soldering process.

The term "solder alloy" used herein encompasses a fusible metal alloy. The term "liquidus temperature" as used herein may encompass the temperature above which a material is completely liquid, and the maximum temperature at which crystals can co-exist with the melt in thermodynamic equilibrium. The Sn-based solder alloy has a liquidus temperature of less than 225° C., preferably less than 220° C., more preferably less than 190° C., even more preferably from 100 to 180° C., still even more preferably from 120 to 160° C. Such liquidus temperatures may enable the use of low reflow temperatures (typically around 20 to 60° C. higher than the liquidus temperature), thereby reducing the occurrence of damage to the photovoltaic (PV) cells. For example, when the PV cells comprise silicon, the solder alloy may be reflowed at a temperature low enough to avoid warpage to the PV cells.

In one embodiment, the alloy is lead-free and/or antimony-free meaning that no lead and/or antimony is added intentionally. Thus, the lead and antimony contents are zero or at no more than accidental impurity levels. The presence of lead and antimony may be hazardous to health. In an alternative embodiment, the alloy may contain lead. The presence of lead may result in favourable mechanical properties of the final solder joint.

Advantageously, the use of solder paste enables the production of interconnections with low voiding (<10%) thereby producing reliable joints.

In addition, the interconnections formed using solder paste can be completely cured making them less susceptible to corrosion-induced failures. Further, the solder paste interconnections offer excellent stability towards moisture, have better electrical conductivity and adhesion. For example, the solder paste can form a reliable bond with an excellent adhesion through the application of the paste, for example, on a metallization pad of the PV cells, such as screen printed silver, copper, or plated copper or silver-coated copper pads or the like.

It will be understood that the solar module may comprise more than two interconnected PV cells. For example greater than 10, optionally greater than 20, optionally greater than 30 PV cells may be interconnected in a single solar module. In one example 60 PV standard size cells may be interconnected to form a solar module. (In shingling this number is >300 cells as each shingle cell is fabricated by cutting standard cell into 5-6 strips.)

In some embodiments the interconnection of the PV cells using the solder paste may comprises interconnecting an interconnect of the first PV cell with an interconnect of the second PV cell. The interconnect may be, for example, a metallized region, pad, finger, busbar, etc. The metallization may comprise, for example copper or silver or plated copper or plated silver. The interconnect may be provided on a front face or a rear face of the PV cell. Each PV cell may comprise one or more interconnects on its front face and/or its rear face. The interconnection may be between an interconnect on a front or rear face of the first PV cell and an interconnect on a front or rear face of the second PV cell. The interconnection may be a direct soldered interconnection between two interconnects. Alternatively, the interconnection may an indirect interconnection comprising, for example, a ribbon extending between the two interconnects that is soldered to the two interconnects.

In some embodiments the method further comprises laminating the plurality of PV cells.

Advantageously, the solder pastes, may have the ability to flow at a first temperature during curing/reflow while keeping the joints stronger during the lamination process. Lamination ensures complete sealing of the interconnected PV cells. As such, in the present disclosure using a solder paste as an interconnecting material in combination with lamination results in the formation of solder joints that exhibit enhanced reliability in severe harsh environments. In addition, the solder pastes of the present disclosure can form compatible bonding with laminating material such as ethyl vinyl acetate (EVA) of polyolefins (POE).

In some embodiments the interconnection between the first PV cell and the second PV cell is established and then subsequently the plurality of PV cells are laminated. Optionally lamination may be performed at a lamination temperature below the liquidus temperature of the solder alloy. In this way further reflowing of the solder may be avoided. Alternatively lamination may be performed at a lamination temperature above the liquidus temperature of the solder alloy. In this way, some additional reflowing of the solder may occur. However, it has been found that the solder joints remain strong even if there is such a secondary reflow.

In some embodiments the solder paste may comprise a non-eutectic solder alloy and the lamination may be performed at a lamination temperature within the plastic range of the non-eutectic solder alloy.

In some other embodiments the interconnection between the first PV cell and the second PV cell is established in-situ during lamination of the plurality of PV cells;

wherein lamination is performed at a lamination temperature at or above the liquidus temperature of the solder alloy. In these embodiments a low melting temperature bismuth-based solder paste is preferred.

In some embodiments the solar module comprises a shingling assembly in which the first PV cell and the second PV cell are at least partially overlapped to form an overlap region;

and a rear face of the first PV cell and a front face of the second PV cell are interconnected in the overlap region using the electrically-conductive adherent comprising or consisting of the solder paste.

In some other embodiments the solar module comprises a back-contact assembly in which a rear face of the first PV cell is interconnected with a rear face of the second PV cell by one or more ribbons, wherein the one or more ribbons are connected to the rear face of the first PV cell and the rear face of the second PV cell using the electrically-conductive adherent comprising or consisting of the solder paste.

In some embodiments the back-contact assembly is an interdigitated back contact (IBC) assembly.

In some other embodiments the solar module comprises a glued assembly in which the first PV cell and the second PV cell are non-overlapping and a front face of the first PV cell is interconnected with a rear face of the second PV cell using one or more ribbons, preferably one or more light-capturing ribbons;

wherein the one or more ribbons are connected to the front face of the first PV cell and the rear face of the second PV cell using the electrically-conductive adherent comprising or consisting of the solder paste.

The methods of the present disclosure are applicable to a wide range of PV cell technologies, including, for example, crystalline silicon (c-Si) architectures such as bifacial, p-type and n-type, standard screen printed silicon solar cells, passivated emitter rear cells (PERC) and heterojunction technology cells (HJT). The methods may additionally be applied to fabrication of thin film or flexible PV module fabrication.

The methods of the present disclosure enable fabrication of assemblies with a large surface area, high mechanical flexibility and even stretchability. Consequently, the methods enable fabrication of structures with electro-active surfaces of arbitrary shape, for example, structure wrapped over car panels, airplane wings, buildings, and three-dimensional (3-D) displays.

In some embodiments the solder paste is stencil printed, jet printed or dispensed. For example, the solder paste may be printable and/or dispensable and/or jettable and/or pin transferable onto the substrate, e.g. the PV cell, ribbon, etc. The solder paste may have viscosity and flow characteristics particularly favourable for dispensing, meaning that the solder paste may be used as a one-to-one replacement for conventional ribbon or wire solder.

Advantageously, the solder paste exhibits a stable viscosity making it particularly suitable for application by stencil printing and enabling a longer stencil life of greater than 12 hours.

Advantageously, stencil printing or dispensing of the solder paste enables better processibility and throughput and more cost effective fabrication compared to conventional ECAs.

In some embodiments the solder paste is reflowed by heating after being printed, jet printed or dispensed. The solder paste may be reflowed using infra-red, a convection oven or a zoned reflow oven for a period of less than 1.5 minute, optionally less than 10 seconds.

Advantageously, the solder paste can be reflowed at low temperatures and has excellent wetting on silver or copper pads of the PV cells.

The solder alloy preferably comprises:

from 45 to 59% wt Bi;

from 0.1 to 1.2 wt. % Cu;

from 0.01 to 0.1 wt. % Co; and optionally up to 1.1 wt. % Ag, the balance being tin together with any unavoidable impurities.

Such a solder alloy is particularly suitable for providing the advantages described above. The combination of elements (in particular the combination of Cu and Co) in the recited amounts may provide favourable mechanical properties to the solder alloy, for example, high tensile strength, high elastic moduli, high toughness, high creep elongation and/or a long creep rupture time. The combination of the recited elements (in particular the combination of Cu and Co) in the recited amounts may also provide a high thermal fatigue resistance and/or a high drop shock resistance. The combination of the recited elements (in particular the combination of Cu and Co) in the recited amounts may also provide high thermal and electrical conductivities. Accordingly, these alloys are particularly suitable for PV cell and photovoltaic ribbon applications. The alloys may be eutectic (with a melting point identical to the liquidus temperature) or non-eutectic (with a melting temperature range). The liquidus temperature may be less than 160° C., for example less than 155° C. Accordingly, damage to the PV cells resulting from warpage to the silicon substrate may be reduced.

It will be appreciated that the alloys described herein may contain unavoidable impurities, although, in total, these are unlikely to exceed 1 wt % of the composition. Preferably, the alloys contain unavoidable impurities in an amount of not more than 0.5 wt % of the composition, more preferably not more than 0.3 wt % of the composition, still more preferably not more than 0.1 wt % of the composition.

The alloys described herein may consist essentially of the recited elements. It will therefore be appreciated that in addition to those elements which are mandatory (i.e. Sn, Bi, Cu and Co) other non-specified elements may be present in the composition provided that the essential characteristics of the composition are not materially affected by their presence. Alternatively, the alloys described herein may consist essentially of the recited elements.

In the solder alloy described above, the solder alloy comprises from 0.1 to 1.2 wt. % Cu. The solder alloy preferably comprises from 0.2 to 1 wt. % Cu. In a preferred embodiment, the solder alloy comprises from 0.7 to 1.1 wt. % Cu, preferably from 0.8 to 1 wt. % Cu. In another preferred embodiment, the solder alloy comprises from 0.1 to 0.3 wt. % Cu, preferably from 0.15 to 0.25 wt. % Cu, even more preferably about 0.2 wt. % Cu. The presence of Cu in the recited amounts may increase ductility, reduce the occurrence of copper leaching and increase resistance to thermal fatigue. In addition, the presence of Cu may contribute to favourable mechanical properties of the final solder joint, in particular high drop shock resistance and high creep rupture resistance.

In the solder alloy described above, the solder alloy comprises from 0.01 to 0.1 wt. % Co. In a preferred embodiment, the solder alloy comprises from 0.02 to 0.09 wt. % Co. In another preferred embodiment, the solder alloy comprises from 0.03 to 0.08 wt. % Co. In another preferred embodiment, the solder alloy comprises from 0.02 to 0.04 wt. % Co, preferably about 0.03 wt. % Co.

The presence of Co in the recited amounts may result in higher toughness, lower Cu dissolution, higher tensile strength and a more refined microstructure. In addition, the presence of Co in the recited amounts may result in a lustrous joint.

The solder alloy described above optionally comprises up to 1.1 wt. % Ag (e.g. from, 0.01 to 1.1 wt. % Ag). The solder alloy preferably comprises up to 1.1 wt. % Ag (e.g. from, 0.01 to 1.1 wt. % Ag), more preferably from 0.5 to 1.1 wt. % Ag, even more preferably from 0.8 to 1 wt. % Ag, still even more preferably from 0.9 to 1 wt. % Ag. The presence of Ag may increase the ductility of the alloy and may also reduce surface oxidation.

In some embodiments, the solder alloy comprises from 48 to 51 wt. % Bi, preferably from 59 to 50 wt. % Bi. Advantageously, such Bi contents result in the alloy exhibiting increased ductility compared to alloys with higher levels of Bi.

Preferably, the solder alloy described above consists of:

from 48 to 51 wt. % Bi,
from 0.7 to 1.1 wt. % Cu,
from 0.02 to 0.09 wt. % Co,
from 0.8 to 1.1 wt. % Ag,
the balance being tin together with any unavoidable impurities.

Such an alloy may have a liquidus temperature of less than 155° C. Such an alloy may be a non-eutectic with a melting temperature range of from 138 to 152° C. Such an alloy may be particularly suitable for providing the advantages described above. In this particularly preferred embodiment, the alloy preferably consists of from 49 to 50 wt. % Bi, from 0.8 to 1 wt. % Cu, from 0.03 to 0.08 wt. % Co, from 0.9 to 1 wt. % Ag, the balance being tin together with any unavoidable impurities.

In some other embodiments the solder alloy comprises from 56 to 59 wt. % Bi, preferably from 57 to 58 wt. % Bi. Advantageously, such Bi contents reduce the melting point of the alloy compared to alloys containing lower levels of Bi.

Preferably, the solder alloy described above consists of:
from 56 to 59 wt. % Bi,
from 0.1 to 0.3 wt. % Cu,
from 0.02 to 0.04 wt. % Co,
the balance being tin together with any unavoidable impurities.

Such an alloy may exhibit a liquid us temperature of less than 140° C., for example about 138° C. Such an alloy may be particularly suitable for providing the advantages described above. In this particularly preferred embodiment, the alloy preferably consists of from 57 to 58 wt. % Bi, from 0.15 to 0.25 wt. % Cu, from 0.025 to 0.035 wt. % Co the balance being tin together with any unavoidable impurities.

In some embodiments, the solder alloy comprises SnPb solder alloy. SnPb solder alloy may exhibit particularly favourable mechanical properties.

In these embodiments, the solder alloy preferably comprises from 5 to 70 wt. % Sn and the balance Pb together with any unavoidable impurities, more preferably from 50 to 70 wt. % Sn and the balance Pb together with any unavoidable impurities. The SnPb solder alloy is preferably a binary solder alloy. In a preferred embodiment, the SnPb alloy is Sn40Pb (liquidus temperature about 183° C.) In another preferred embodiment, the SnPb alloy is Sn37Pb (liquidus temperature about 183° C.).

In some embodiments the solder alloy comprises:
from 35 to 60 wt. % Bi;
from 0 to 2 wt. % Ag,
the balance being Sn together with any unavoidable impurities.

Such alloys may be particularly suitable in back contact assemblies.

In these embodiments, the solder alloy preferably comprises from 40 to 60 wt. % Bi, more preferably either from 41 to 45 wt. % Bi or from 56 to 60 wt. % Bi. For example, the solder alloy may comprise Sn57Bi43 or Bi58Sn42 alloys.

In these embodiments, the solder alloy preferably comprises from 0.5 to 1.5 wt. % Ag, more preferably from 0.7 to 1.3 wt. % Ag, even more preferably about 1 wt. % Ag. For example, the solder alloy may comprise 57Bi-42Sn-1Ag.

In some embodiments the solder alloy comprises:
from 0.01 to 5 wt. % Ag;
from 0.02 to 1.5 wt. % Cu;
optionally:
    from 0.08 to 20 wt. % Bi;
    from 0 to 0.1 wt. % P;

from 0 to 0.02 wt. % of a rare earth mixture consisting of a mixture of 53 wt. % Ce, 24 wt. % La, 16 wt. % Nd and 5 wt. % Pr; and from 0 to 0.01 wt. % Sb the balance being Sn together with any unavoidable impurities.

Such alloys may be particularly suitable in back contact assemblies.

In these embodiments, the solder alloy preferably comprises from 1.5 to 4.5 wt. % Cu, preferably from 2 to 4 wt. % Cu, more preferably from 2.5 to 3.5 wt. % Ag, even more preferably about 3 wt. % Ag. In these embodiments, the solder alloy preferably comprises from 0.1 to 1 wt. % Cu, more preferably from 0.2 to 0.8 wt. % Cu, even more preferably from 0.4 to 0.6 wt. % Cu, even more preferably about 0.5 wt. % Cu. In these embodiments the solder alloy preferably comprises SAC305.

In these embodiments, when the solder alloy comprises Bi the solder alloy preferably comprises:

from 0.08 to 8 wt. % Bi, more preferably from 3 to 6 wt. % Bi;

from 0.1 to 0.7 wt. % Cu;

from 0.05 to 0.5 wt. % Ag, more preferably from 0.1 t 0.4 wt. % Ag.

In other embodiments, the solder paste can be used in conjunction with ECAs. For example, alternating PV cells may be interconnected using solder paste and ECA. For example, a first PV cell may be interconnected to a second PV cell using the electrically-conductive adherent comprising or consisting of the solder paste as discussed above. A third PV cell may be interconnected to the second PV cell using ECA. A fourth PV cell may be interconnected to the third PV cell using the electrically-conductive adherent comprising or consisting of the solder paste as discussed above, and so on. In another example of combining the use of solder paste and ECA, the PV cells may be printed with ECA and interconnected to provide a mechanical interconnection and the electrically-conductive adherent comprising or consisting of the solder paste as discussed above may be used for bus connections.

The solder flux preferably comprises:

a rosin and/or a resin, and/or an activator, and/or a surfactant, and/or a solvent, and optionally a rheology modifying agent and/or corrosion inhibitor.

The components of the solder flux are typically selected so that they are able to be removed from the paste (for example by evaporation and/or burn out) at a temperature below the targeted reflow temperature of the solder alloy. This may help to promote near complete sintering of the metal particles. When organic material remains in the joint during reflow, inadequate sintering of the metal particles may occur. This may result in a weak solder joint.

The rosin and/or resin may be particularly suitable for providing the paste with rheological properties favourable for stencil printing the paste. Non-limiting examples of rosin/resins are gum rosin, hydrogenated rosins, esterified rosins, modified rosin resin or dimerized rosins, with varied degree of softening points and acid values. The rosin and/or a resin is preferably a rosin. The use of rosin is advantageous over epoxy or acrylic binders in terms of better reliability, spread, oxygen removal and forming non-interfering residues.

The activator may serve to remove any metal oxide that may be present from the surface being printed, e.g. the PV cell, ribbon, etc., and/or to remove any oxides that may be present in the solder alloy. Aryl or alkyl carboxylic acids may be used as activators, such as, for example, one or more of adipic acid, succinic acid and glutaric acid.

The surfactant may control the rheological or other functional properties of the solder paste. The surfactant may be anionic, cationic or non-ionic. Non-limiting examples include surfactants available under the tradenames SPAN-80, SPAN-20, Tween-80, Triton-X-100, Sorbitan, IGEPAL-CA-630, Nonidet P-40, Cetyl alcohol, FS-3100, FS-2800, FS-2900. FS-230, FS-30.

The solvent (typically a combination of solvents) is typically selected to facilitate evaporation of solvents before solidification of solders. Typical solvent compositions include, for example, monoterpene alcohols, glycols, glycol esters, glycol ethers and combinations thereof. Non-limiting examples includes, hexyl carbitol, diethylene glycol dibutyl ether, tripropyleneglycol monobutyl ether terpineol and diethylene glycol mono-n-butyl ether.

The solder flux may further comprise a rheology modifying agent to control the viscosity of the paste. Examples of suitable rheology modifiers include, but are not restricted to, Thixcin R, Crayvallac Super, and combinations thereof.

The solder flux may further comprises a corrosion inhibitor, preferably comprising a triazole derivative, more preferably comprising one or more of benzotriazole, tolyltriazole, and carboxybenzotriazole. The presence of such corrosion inhibitors may help to protect the resulting solder joint during ambient storage or during electrical or thermal reliability testing conditions.

The solder paste preferably comprises from 75 to 95 wt. % of the particles of solder alloy, more preferably from 80 to 92 wt. %. The solder paste preferably comprises from 5 to 25 wt. % of the solder flux, more preferably from 8 to 20 wt. %.

The solder flux preferably comprises:

from 25 to 40 wt. % of the rosin and/or the resin, and/or from 12 to 20 wt. % of the activator, and/or from 10 to 20 wt. % of the surfactant, and/or from 20 to 40 wt. % of the solvent, and/or from 1 to 10 wt. % of the rheology modifying agent, and/or from 0.5 to 3 wt. % of the corrosion inhibitor.

In a second aspect the present disclosure provides a solar module comprising a plurality of interconnected photovoltaic (PV) cells;

wherein at least a first PV cell is interconnected to a second PV cell using an electrically-conductive adherent comprising or consisting of a solder paste;

wherein the solder paste comprises particles of solder alloy dispersed in a solder flux and the solder alloy comprises a Sn-containing solder alloy having a liquidus temperature of less than 225° C.

In some embodiments the solar module may comprise:

a shingling assembly in which the first PV cell and the second PV cell are at least partially overlapped to form an overlap region and a rear face of the first PV cell and a front face of the second PV cell are interconnected in the overlap region; or a back-contact assembly in which a rear face of the first PV cell is interconnected with a rear face of the second PV cell by one or more ribbons; or a glued assembly in which the first PV cell and the second PV cell are non-overlapping and a front face of the first PV cell is interconnected with a rear face of the second PV cell using one or more ribbons, preferably one or more light-capturing ribbons.

Preferably the solar module is fabricated according to the method described in the first aspect above.

In a third aspect the present disclosure provides a method of fabricating a solar module by interconnection of a plurality of photovoltaic (PV) cells in which at least a first PV cell is interconnected to a second PV cell using solder-flux comprising a binder system but no solder alloy.

Preferably the binder system is an organic binder system. The binder system may correspond to the solder flux described herein.

Preferably the interconnection comprises one or more ribbons that connected to a front face of the first PV cell and a rear face of the second PV cell using the solder-flux.

BRIEF DESCRIPTION OF THE DRAWINGS

One or more embodiments of the disclosure will now be described, by way of example only, with reference to the accompanying drawings in which.

DETAILED DESCRIPTION

Unless defined otherwise, all technical and scientific terms used in this specification have the same meaning as is commonly understood by the reader skilled in the art to which the claimed subject matter belongs. It is to be understood that the foregoing summary of the disclosure and the following examples are exemplary and explanatory only and are not restrictive of any subject matter claimed.

The following description is directed to embodiments of the disclosure. The description of the embodiments is not meant to include all the possible embodiments of the disclosure that are claimed in the appended claims. Many modifications, improvements and equivalents which are not explicitly recited in the following embodiments may fall within the scope of the appended claims. Features described as part of one embodiment may be combined with features of one or more other embodiments unless the context clearly requires otherwise.

According to the present disclosure a method of fabricating a solar module by interconnection of a plurality of photovoltaic (PV) cells is provided in which at least a first PV cell is interconnected to a second PV cell using an electrically-conductive adherent comprising or consisting of a solder paste.

At a general level a solder paste is used to produce a solder joint using the following steps:

providing a solder flux with particles of solder alloy dispersed in the solder flux to form the solder paste;

providing two or more work pieces, e.g. two PV cells or a PV cell and an interconnect, to be joined;

depositing the solder paste on at least one of the two or more work pieces; and heating the solder paste in the vicinity of the two or more work pieces to be joined to form a solder joint between the two or more work pieces.

In the following methods of fabricating solar modules will be described, for example only, for a better understanding of the present disclosure.

In a shingling assembly, a solar cell may be cut into 3 to 6 stripes (the shingles) that are subsequently assembled in strings by connecting a front face of each shingle to a back face of the next one. Shingled strings are made of several PV cells and can be up to 2 meters long. Shingled strings can be connected by bussing ribbons in series or parallel arrangement.

Figure 1:
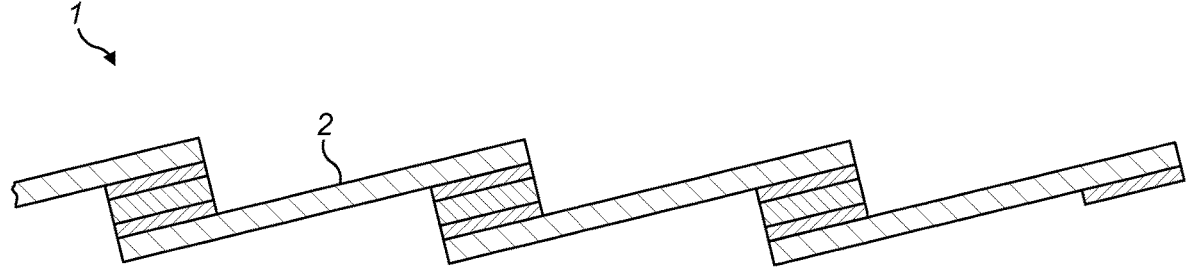
FIGS. 1 and 2 are a schematic illustration of a shingling assembly comprised of a plurality of individual PV cells.
Figure 2:
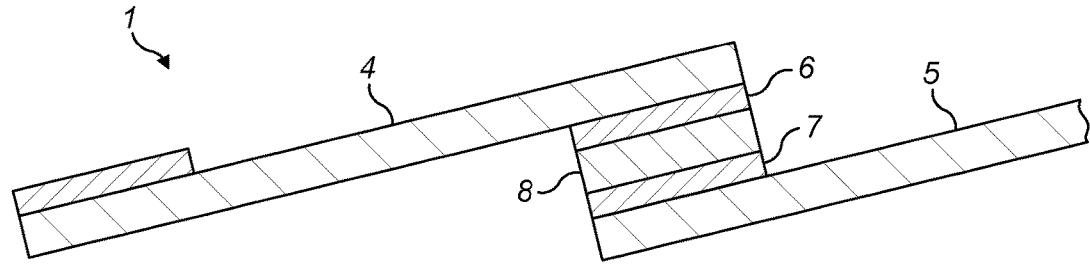

FIGS. 1 and 2 illustrate schematically an example of a shingling assembly 1 comprised of a plurality of individual PV cells 2. As most clearly shown in the enlargement of FIG. 2, the shingling assembly 1 comprises at least a first PV cell 4 and a second PV cell 5 that are at least partially overlapped to form an overlap region. A rear face of the first PV cell 4 and a front face of the second PV cell 5 are interconnected in the overlap region using an electrically-conductive adherent comprising or consisting of the solder paste to form a solder joint 8. The first PV cell 4 may comprise an interconnect 6 on its rear face and the second PV cell 5 may comprise an interconnect 7 on its front face. In the illustrated example both interconnects 6, 7 comprise metallized pads, e.g. a busbar that may extend across the width of the PV cells 4, 5. The solder joint 8 may be formed directly between the interconnects 6, 7.

Shingling can be applied to any PV cell architecture as long as interconnects (e.g. contact pads) are on the opposite sides of the PV cell. It can be applied, for example, to BSF, PERC, bifacial-PERC, n-PERT/PERL, HJ, among other architectures.

In back contact assemblies all or part of the interconnects may be located on the rear face of the PV cells.

Figure 3:
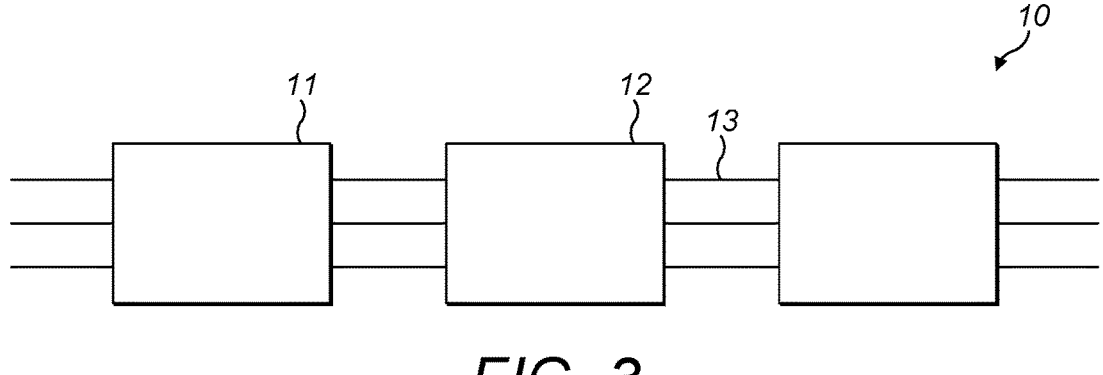
FIG. 3 is a schematic illustration of a back contact assembly comprised of a plurality of individual PV cells.

FIG. 3 illustrates schematically an example of a back contact assembly 10 comprised of a plurality of individual PV cells 11, 12. A rear face of the first PV cell 11 is interconnected with a rear face of the second PV cell 12 by one or more ribbons 13. The one or more ribbons 13 are connected to the rear face of the first PV cell 11 and the rear face of the second PV cell 12 using the electrically-conductive adherent comprising or consisting of the solder paste.

The one or more ribbons 13 may be copper foil ribbon.

Figure 4:
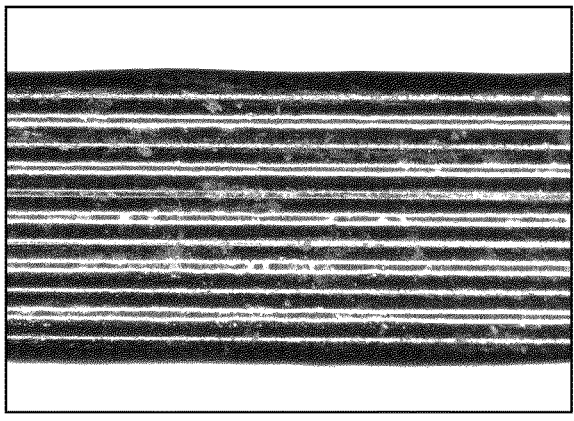
FIG. 4 shows plan and sectional photographs of a light-capturing ribbon.
Figure 4:

In a glued assembly a first PV cell and a second PV cell are non-overlapping and a front face of the first PV cell is interconnected with a rear face of the second PV cell using one or more ribbons, preferably one or more light-capturing ribbons. Light-capturing ribbons are typically grooved, as shown in FIG. 4, to enhance their light-capturing capability. This can make it difficult to form a bonding with a PV cell interconnect pad using conventional procedures.

Figure 5:
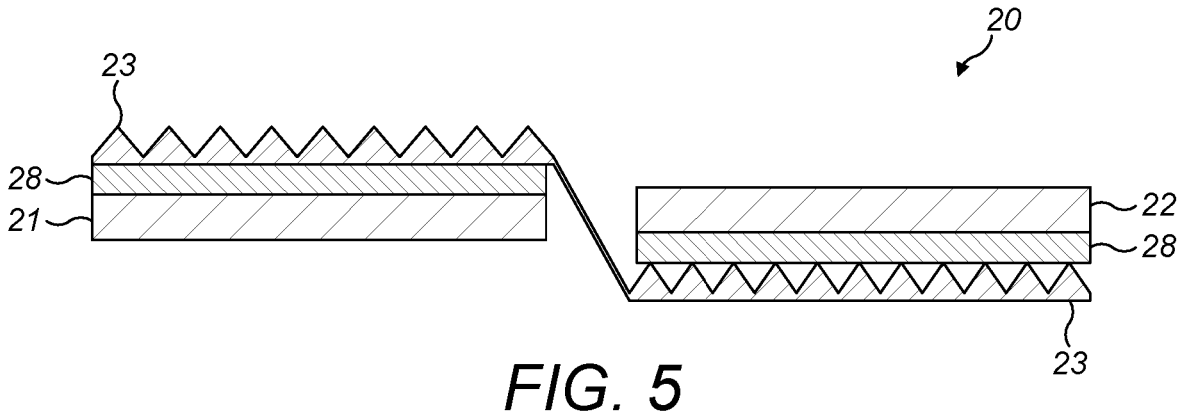
FIG. 5 is a schematic illustration of a glued assembly comprised of a plurality of individual PV cells.

FIG. 5 illustrates schematically an example of a glued assembly 20 comprised of a plurality of individual PV cells 21, 22 interconnected using light-capturing ribbons 23. The one or more light-capturing ribbons 23 are connected to the front face of the first PV cell 21 and the rear face of the second PV cell 22 using the electrically-conductive adherent comprising or consisting of the solder paste to form a solder joint 28.

The solder paste may be, for example, stencil printed, jet printed or otherwise dispensed onto the front face and/or rear face of the PV cells or light-capturing ribbons.

The solder pastes of the present disclosure have been found to exhibit excellent stability with their metal content remaining almost unchanged even after 12 hours of continuous printing. In particular, viscosity build-up has been found to be limited and consequently the solder paste can be stencil printed for hours without cleaning the stencil. In addition, use of solder paste enables high print definition and high speed. For example, even at high printing speed, the observed transfer efficiency with solder paste can be over 90%. By comparison, generally ECAs do not have a stencil/screen life of more than 4 hours. After that, the viscosity of ECA increases rapidly and often insufficient transfer and screen pore clogging is observed.

The solder paste may be reflowed by heating after being stencil printed, jet printed or dispensed. For example, the solder paste may be reflowed using infra-red, a convection oven or a zoned reflow oven for a period of less than 1 minute, optionally less than 10 seconds.

In other embodiments of the present invention there is provided a method of fabricating a solar module by interconnection of a plurality of photovoltaic (PV) cells in which at least a first PV cell is interconnected to a second PV cell using solder-flux comprising a binder system but no solder alloy.

Preferably the binder system is an organic binder system.

Preferably the interconnection comprises one or more ribbons that connected to a front face of the first PV cell and a rear face of the second PV cell using the solder-flux.

The method of the present disclosure may beneficially result in an improved peel strength of the interconnection between the PV cells. For example, in a first test of the peel strength of bus ribbon connections it was found that ECA produced a peel strength of about 0.5 N compared to a peel strength of about 2.5 N for a solder paste comprising Sn40Pb solder alloy.

The method of the present disclosure may beneficially result in an improved shear strength of the interconnection between the PV cells. For example, in a second test of the shear strength of the interconnection PV cells were interconnected using:
1) ECA,
2) a solder paste comprising Sn40Pb solder alloy, and
3) a solder paste comprising a solder alloy consisting of:
   from 48 to 51 wt. % Bi,
   from 0.7 to 1.1 wt. % Cu,
   from 0.02 to 0.09 wt. % Co,
   from 0.8 to 1.1 wt. % Ag,
   the balance being tin together with any unavoidable impurities.

For 1) a shear strength of only 6.3 N was obtained and it was observed that the interconnection shattered along the ECA join. For 2) a shear strength of 9.8 N was obtained. For 3) a shear strength of 10.5 N was obtained. In both 2) and 3) it was observed that no failure occurred at the soldered joint but instead shear failure occurred due to failure of the PV cell material.

The method of the present disclosure may beneficially result in an improved thermal ageing of the interconnection between the PV cells. For example, in a third test PV cells were interconnected using:
1) ECA,
2) a solder paste comprising Sn40Pb solder alloy,
3) a solder paste comprising a solder alloy consisting of:
   from 48 to 51 wt. % Bi,
   from 0.7 to 1.1 wt. % Cu,
   from 0.02 to 0.09 wt. % Co,
   from 0.8 to 1.1 wt. % Ag,
   the balance being tin together with any unavoidable impurities, and
4) a solder paste comprising a solder alloy consisting of:

from 56 to 59 wt. % Bi,
   from 0.1 to 0.3 wt. % Cu,
   from 0.02 to 0.04 wt. % Co,
   the balance being tin together with any unavoidable impurities.

The samples were then thermally aged according to IEC standard 61215. After 600 test cycles and 800 test cycles the following % power changes were observed:

|  | % Power change at T600 cycles | % Power change at T800 cycles |
|---|---|---|
| 1) | −9% | −9.5% |
| 2) | −0.5% | −1.25% |
| 3) | −0.5% | −1.25% |
| 4) | −1.0% | −2.25% |

The method of the present disclosure may beneficially result in a lower contact resistance of the interconnection between the PV cells. For example, in a fourth test PV cells were interconnected using the same adhesives/solder alloys as used in the third test. The following contact resistances were observed:

|  | Contact resistance (mΩ · cm2) |
|---|---|
| 1) | 3.1 |
| 2) | 2.3 |
| 3) | 0.55 |
| 4) | 1.5 |

The following examples are provided for a better understanding of the present disclosure and are not limiting on the scope of the appended claims.

Example 1

The front face of a shingled cell busbar was printed with a solder paste comprising a solder flux having dispersed therein particles of a solder alloy of the following composition:
   from 48 to 51 wt. % Bi,
   from 0.7 to 1.1 wt. % Cu,
   from 0.02 to 0.09 wt. % Co,
   from 0.8 to 1.1 wt. % Ag,
   the balance being tin together with any unavoidable impurities The shingled cells were made by splitting a multicrystalline 6″ Al-BSF (Aluminum back surface field) solar cell into five individual shingle cell stripes by laser cutting.

Figure 6:
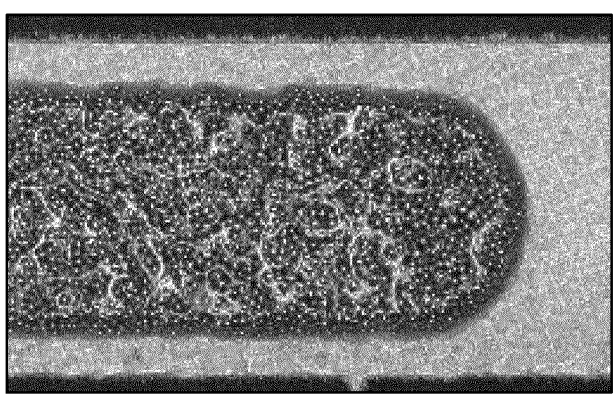
FIG. 6 is a photograph of solder paste stencil printed onto a 1 mm wide busbar prior to reflowing.
Figure 7:
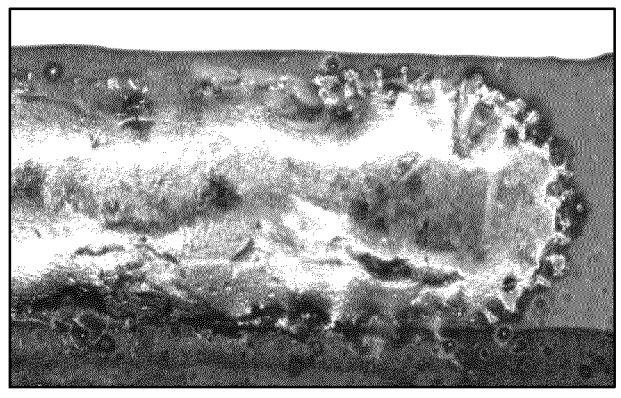
FIG. 7 is a photograph of the solder pad of FIG. 6 after reflowing.

Solder paste was printed onto the 1 mm wide busbars using a 3 mil stencil on a DEK03Xi printing machine, as shown in FIG. 6. The width of the printed solder paste pads was from 300 to 900 microns prior to reflowing. The height of the printed solder paste pads was 65 microns prior to reflowing. After a fast reflow the solder paste spreads completely to fill the width of the busbar, as shown in FIG. 7. The height of the solder paste pad was reduced down to 55 micron.

Then the stripes were shingled with a fixed overlap of 1.0 mm. This assembly was snap reflowed in a reflow oven at 175° C. peak temperature. Total reflow time was less than 1 minute in a standard reflow oven. Finally, bus soldering was done using ribbon attachment.

The quality and strength of the joint was assessed by determining the strength of adhesion of an interconnect material, die (solder paste/ECA) to the silver pad, by subjecting the die (paste/shingled cell) to a stress that's parallel to the plane of die attach substrate, resulting in a shearing stress between the die-die attach material interface and the die attach material-substrate interface. In this technique, reflowed solder paste and two cell shingled assembly was sheared using die shearing method. The solder paste assemblies yielded a shear strength of over 8N for as reflowed test as well as 2 cell shingled assemblies. ECA, on the other hand, yielded shear strength of only about 3.4N on shingled assemblies. Microscopic inspection of joint revealed that solder paste form thin and continuous IMC (intermetallic compound) layer with silver pads, while there is no IMC formation in case of ECA, and silver particles found to be suspended in organic binder matrix.

The assembly was then analysed for voiding and cracks and then laminated at 138° C. for 20 minutes using standard ethy-vinyl acetate (EVA) laminating material.

EL (electroluminescence) imaging, I-V curve values and mechanical and environmental tests were performed on the assembly. Test results indicate that the change in maximum power ($P_{max}$) value was less than ±5% and hence the assembly passed the reliability requirement as per IEC61215. Both, thermal cycle and damp heat test were extended up to 600 cycles and 2000 hours respectively.

Example 2

Example 1 was repeated except that instead of a reflow oven, IR (infra-red) curing was used to make the assembly. The IR reflowing was done at 50% IR power for 4-5 seconds.

Example 3

Example 1 was repeated except that shingling was done using ECA and bus soldering to tin-lead ribbon was achieved by dispensing solder paste on the silver pads

Example 4

A back contact assembly was fabricated using IBC cells. The back side of the IBC cell consists of fine silver lines (200 micron wide). The solder paste of Example 1 was printed on those tracks and standard copper tabbing ribbons were placed atop. Another cell may be connected through these ribbons. Complete wetting of solder paste on silver pads observed. No solder ball formation or silver leaching noted. Peel strength was >1N. Similar assemblies with ECA did not yield acceptable joint strength.

The whole assembly was then reflowed in a reflow oven with a peak temperature 175° C. Lamination was then performed as per described in Example 1.

I-V curve values and mechanical and environmental tests were performed on the assembly. Test results indicate that the change in maximum power ($P_{max}$) value was less than ±5% and hence the assembly passed the reliability requirement as per IEC61215.

Example 5

Example 4 was repeated except that soldering and lamination was achieved in a single operation. Polyolefin Elastomer (POE) laminating material was used for this purpose and the lamination temperature was 168° C. for 20 minutes.

Example 6

Example 4 was repeated except that conductive copper foil (conductive backsheet) was used instead of ribbons for interconnection.

Example 7

A glued assembly of series-connected PV cells was fabricated by an automated tabbing machine (Sunnyworld H1300 tabbing and stringing machine). The solder paste of Example 1 was either dispensed or printed onto the PV cell busbar. Stretched ribbon was then placed over the solder paste. This assembly was passed through the preheating zone of the automated tabbing machine. After the specified preheating time, IR (infra red) soldering was performed at 50% power for 1-2 sec. Multiple cells were tabbed and stringed in this process. The panels were laminated and analyzed for I-V curve values and mechanical and environmental tests. Test results indicate that the change in maximum power ($P_{max}$) value was less than ±5% and hence the assemblies passed the reliability requirement as per IEC61215.

Example 8

Example 7 was repeated except that solder-flux was used instead of solder paste. The solder-flux contains a binder system, preferably an organic binder system, but no solder alloy.

Example 9

Example 7 was repeated except that light-capturing ribbon was used. Solder paste was printed on the ribbon and soldered at the back side of the cell. The front side soldering was achieved by usual fluxing method or using Ready Ribbon™. The panels were laminated and analyzed for I-V curve values and mechanical and environmental tests. Test results indicate that the change in maximum power ($P_{max}$) value was less than ±5% and hence the assemblies passed the reliability requirement as per IEC61215.

It is to be understood that at least some of the figures and descriptions of the disclosure have been simplified to focus on elements that are relevant for a clear understanding of the disclosure, while eliminating, for purposes of clarity, other elements that the reader skilled in the art will appreciate may also be required. Because such elements are well known to the reader skilled in the art, and because they do not necessarily facilitate a better understanding of the disclosure, a description of such elements is not provided herein.

The invention claimed is:

1. A method of fabricating a solar module by interconnection of a plurality of photovoltaic (PV) cells in which at least a first PV cell is interconnected to a second PV cell using an electrically-conductive adherent comprising or consisting of a solder paste;

the solder paste comprising particles of solder alloy dispersed in a solder flux;

wherein the solder alloy comprises from 48 to 51 wt. % Bi, from 0.7 to 1.1 wt. % Cu, from 0.02 to 0.09 wt. % Co, from 0.8 to 1.1 wt. % Ag, and the balance being tin together with any unavoidable impurities, and wherein the solder alloy has a liquidus temperature of less than 225° C.;

wherein the solder flux comprises:

from 25 to 40 wt. % of a rosin and/or a resin, from 12 to 20 wt. % of an activator, from 10 to 20 wt. % of a surfactant, and from 20 to 40 wt. % of a solvent;

wherein the solar module comprises a back-contact assembly in which a rear face of the first PV cell is directly interconnected with a rear face of the second PV cell by one or more ribbons, wherein the one or more ribbons are connected to the rear face of the first PV cell and the rear face of the second PV cell using the electrically-conductive adherent comprising or consisting of the solder paste; and wherein the solder paste is stencil printed or jet printed.

2. The method of claim 1, further comprising laminating the plurality of PV cells.

3. The method of claim 2, wherein the interconnection between the first PV cell and the second PV cell is established and then subsequently the plurality of PV cells are laminated;

and optionally wherein lamination is performed at a lamination temperature below the liquidus temperature of the solder alloy; or optionally wherein lamination is performed at a lamination temperature above the liquidus temperature of the solder alloy.

4. The method of claim 2, wherein the interconnection between the first PV cell and the second PV cell is established in-situ during lamination of the plurality of PV cells;

wherein lamination is performed at a lamination temperature at or above the liquidus temperature of the solder alloy.

5. The method of claim 1, wherein the solder paste is reflowed by heating after being stencil printed, or jet printed and the reflow temperature is 20 to 60° C. higher than the liquidus temperature.

6. The method of claim 5, wherein the solder paste is reflowed using infra-red, a convection oven or a zoned reflow oven for a period of less than 1 minute, optionally less than 10 seconds.

7. The method of claim 1, wherein the solder alloy comprises from 0.8 to 1 wt. % Cu.

8. The method of claim 1, wherein the solder alloy comprises from 0.03 to 0.08 wt. % Co.

9. The method of claim 1, wherein the solder alloy comprises from 0.9 to 1 wt. % Ag.

10. The method of claim 1, wherein the solder alloy consists of:

from 48 to 51 wt. % Bi, from 0.7 to 1.1 wt. % Cu, from 0.02 to 0.09 wt. % Co, from 0.8 to 1.1 wt. % Ag, the balance being tin together with any unavoidable impurities.

11. The method of claim 1, wherein the one or more ribbons are copper foil ribbon(s).

* * * * *